United States Patent
Numata

(10) Patent No.: US 9,040,888 B2
(45) Date of Patent: May 26, 2015

(54) SOLID STATE IMAGE SENSOR WITH PROTECTION AGAINST CERTAIN INCIDENT LIGHT

(75) Inventor: Aihiko Numata, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 247 days.

(21) Appl. No.: 13/297,901

(22) Filed: Nov. 16, 2011

(65) Prior Publication Data

US 2012/0119068 A1     May 17, 2012

(30) Foreign Application Priority Data

Nov. 17, 2010  (JP) ................................ 2010-257240

(51) Int. Cl.
*H01L 27/146*     (2006.01)

(52) U.S. Cl.
CPC ................ *H01L 27/14621* (2013.01)

(58) Field of Classification Search
USPC .................. 250/208.1, 226, 239, 208.2, 216;
257/440, 431–435, 678, 680, 294;
348/302–311, 294, 332, 335, 336, 340,
348/272, 273, 276; 356/4.01–4.07, 3–22;
438/64–66, 69, 70, 72, 116, 57
See application file for complete search history.

(56) References Cited

U.S. PATENT DOCUMENTS

| | | | |
|---|---|---|---|
| 5,216,680 A * | 6/1993 | Magnusson et al. | 372/20 |
| 6,624,956 B1 * | 9/2003 | Shechterman | 359/831 |
| 6,630,999 B2 * | 10/2003 | Shroder | 356/419 |
| 6,829,008 B1 * | 12/2004 | Saga | 348/302 |
| 6,873,099 B2 * | 3/2005 | Maeda | 313/504 |
| 7,253,394 B2 * | 8/2007 | Kang | 250/216 |
| 7,420,677 B2 * | 9/2008 | Schmidt et al. | 356/417 |
| 7,858,921 B2 * | 12/2010 | Stanton et al. | 250/226 |
| 8,080,776 B2 * | 12/2011 | Kurahashi et al. | 250/216 |
| 8,143,084 B2 * | 3/2012 | Lee | 438/57 |
| 8,604,581 B2 * | 12/2013 | Ueno et al. | 257/444 |
| 2003/0112523 A1 * | 6/2003 | Daniell | 359/626 |
| 2008/0062418 A1 * | 3/2008 | Magnusson et al. | 356/307 |

(Continued)

FOREIGN PATENT DOCUMENTS

| | | |
|---|---|---|
| JP | 3592147 B2 | 11/2004 |
| JP | 2007-041555 A | 2/2007 |
| JP | 2007-150592 A | 6/2007 |

OTHER PUBLICATIONS

L. Mashev et al., "Zero Order Anomaly of Dielectric Coated Gratings", Optics Communications, vol. 55, No. 6, Oct. 15, 1985, pp. 377-380.

*Primary Examiner* — Georgia Y Epps
*Assistant Examiner* — Carolynn A Moore
(74) *Attorney, Agent, or Firm* — Fitzpatrick, Cella, Harper & Scinto

(57) ABSTRACT

A solid state image sensor includes a plurality of pixels, each having a photoelectric conversion section formed in the inside of a substrate and a light-receiving section formed on the side of a light-receiving surface of the substrate. At least a part of the plurality of pixels is ranging pixels. The light-receiving section of each of the ranging pixels is equipped with a guided mode resonant filter adapted to reflect incident light getting into the inside of the light-receiving section at a specific incident angle. The normal line of the guided mode resonant filter is inclined relative to the principal ray of the flux of light entering the guided mode resonant filter.

21 Claims, 17 Drawing Sheets

(56) References Cited

U.S. PATENT DOCUMENTS

| | | | |
|---|---|---|---|
| 2009/0242951 A1* | 10/2009 | Ueno et al. | 257/292 |
| 2009/0294634 A1* | 12/2009 | Kurahashi et al. | 250/208.1 |
| 2010/0051785 A1* | 3/2010 | Dai et al. | 250/208.1 |
| 2010/0253828 A1* | 10/2010 | Yamada | 348/340 |
| 2010/0259668 A1* | 10/2010 | Yamada | 348/340 |
| 2011/0013055 A1* | 1/2011 | Sul et al. | 348/273 |
| 2011/0079867 A1 | 4/2011 | Numata et al. | 257/432 |

* cited by examiner

| A | 175nm |
|---|---|
| B | 175nm |
| C | 148nm |
| ε1 | 5.65 |
| ε2 | 1.96 |
| ε3 | 2.31 |

| A | 140nm |
|---|---|
| B | 140nm |
| C | 148nm |
| ε1 | 5.65 |
| ε2 | 1.96 |
| ε3 | 2.31 |

| A | 175nm |
|---|---|
| B | 175nm |
| C | 148nm |
| ε1 | 5.65 |
| ε2 | 1.96 |
| ε3 | 2.31 |
| ε4 | 2.31 |
| α | 9.5 DEGREE |

FIG. 16A
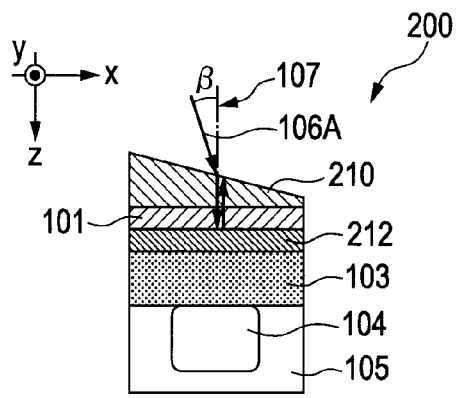
FIG. 16B
| A | 210nm |
|---|---|
| B | 210nm |
| C | 148nm |
| ε1 | 5.65 |
| ε2 | 1.96 |
| ε3 | 2.31 |
| ε4 | 2.31 |
| α | 9.5 DEGREE |
FIG. 16C
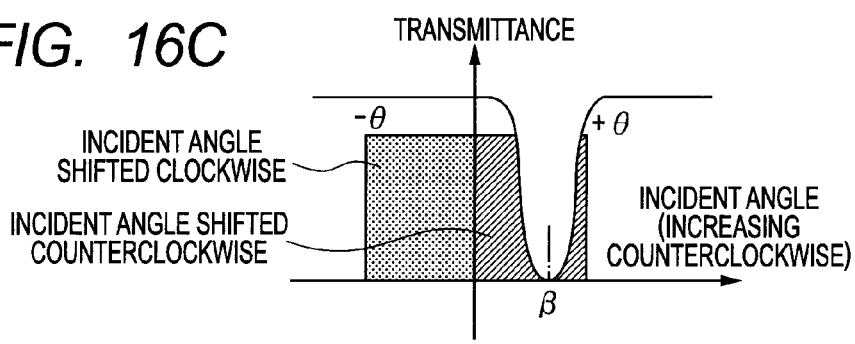
FIG. 16D
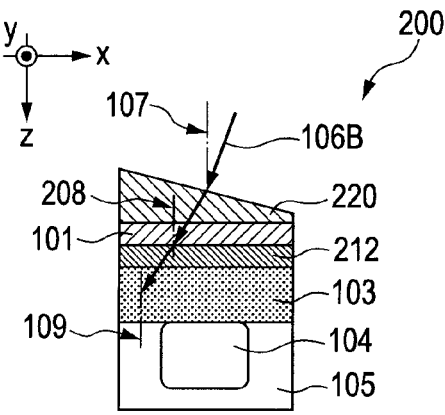

SOLID STATE IMAGE SENSOR WITH PROTECTION AGAINST CERTAIN INCIDENT LIGHT

BACKGROUND OF THE INVENTION

1. Field of the Invention

The present invention relates to a solid state image sensor. More particularly, the present invention relates to a solid state image sensor to be used for a digital still camera or a digital video camera.

2. Description of the Related Art

Japanese Patent No. 3,592,147 discloses a solid-state imaging device having an image sensor with some of its pixels provided with a ranging function for detecting distances by phase detection as a distance sensing technique for ranging to be used for digital still cameras and digital video cameras.

Unlike conventional contrast measurement systems, the disclosed solid-state imaging device does not need to drive a lens for measuring distances and hence can operate for high precision ranging at high speed. Additionally the disclosed solid-state imaging device can operate for real time ranging when picking up a moving image.

With regard to the structure of the ranging pixels, each of the ranging pixels has between a micro-lens and a photoelectric conversion section an aperture that is off centered with respect to the optical center of the micro-lens.

This arrangement enables selective introduction of light that passes through a predetermined region on the pupil of the camera lens to the photoelectric conversion section to carry out ranging.

SUMMARY OF THE INVENTION

However, in a solid-state imaging device according to Japanese Patent Publication No. 3,592,147, the position of the aperture and the position of the pupil of the camera lens are not exactly conjugated and such an off centered aperture cannot satisfactorily operate for flux separation due to scattering of light caused by a wiring section so that the device is not necessarily satisfactory for improvement of ranging precision. Particularly, as the pixel size is reduced, the F value of the micro-lens for leading light to the photoelectric conversion section is increased to make the pixel size substantially equal to the size of the diffraction image.

Then, light spreads in the pixel and hence the off centered aperture cannot operate satisfactorily for flux separation. Thus, efforts are required for improvement of ranging precision.

In view of the above-identified problem, an object of the present invention is to provide a solid state image sensor that operates with an improved level of ranging precision.

According to the present invention, the above object is achieved by providing a solid state image sensor including a plurality of pixels, each having a photoelectric conversion section formed in the inside of a substrate and a light-receiving section formed on the side of a light-receiving surface of the substrate, wherein at least a part of the plurality of pixels are ranging pixels, the light-receiving section of each of the ranging pixels is equipped with a guided mode resonant filter adapted to reflect incident light getting into the inside of the light-receiving section at a specific incident angle, and the normal line of the guided mode resonant filter is inclined relative to the principal ray of the flux of light entering the guided mode resonant filter.

Thus, the present invention can provide a solid state image sensor that can operate with an improved level of ranging precision.

Further features of the present invention will become apparent from the following description of exemplary embodiments with reference to the attached drawings.

BRIEF DESCRIPTION OF THE DRAWINGS

FIG. 16A is a schematic illustration of propagation of light according to the second embodiment of the present invention.

FIG. 16B is a schematic illustration of propagation of light according to the second embodiment of the present invention.

FIG. 16C is a schematic illustration of propagation of light according to the second embodiment of the present invention.

FIG. 16D is a schematic illustration of propagation of light according to the second embodiment of the present invention.

DESCRIPTION OF THE EMBODIMENTS

The present invention is characterized in that particularly the normal line of each of the guided mode resonant filters is inclined relative to the principal ray of the flux of light entering the guided mode resonant filter on the basis of the characteristic of a guided mode resonant filter that the transmittance of the guided mode resonant filter varies as a function of the incident angle of incident light.

With this arrangement, only incident light entering the guided mode resonant filter at a specific incident angle can be detected. Thus, the present invention realizes a solid state image sensor that can operate for high precision ranging on the basis of this arrangement.

A filter utilizing a guided mode resonator as disclosed in Mashev, L. et al. "Zero Order Anomaly of Dielectric Coated Gratings", Optical Communication, 55, pp. 377-380, 1985 can be employed as a guided mode resonant filter for the purpose of the present invention. In other words, a filter having a known structure where a high permittivity section and a low permittivity section are arranged periodically can be employed for the purpose of the present invention.

Now, the present invention will be described below in greater detail by way of preferred embodiments of solid state image sensor of the invention having respective configurations.

Throughout the drawings illustrating the embodiments, the components having the same functions are denoted by the same reference symbols and will not be described repeatedly.

Note that the gate electrodes and the wirings that are not directly related to the present invention are omitted from the drawings.

First Embodiment

The first embodiment of the solid state image sensor according to the present invention will be described below by referring to the related drawings.

The solid state image sensor of this embodiment includes a plurality of pixels, each of which has a photoelectric conversion section formed in the inside of a substrate and a light-receiving section formed on the side of a light-receiving surface of the substrate. At least, a part of the plurality of pixels is ranging pixels.

Figure 1:
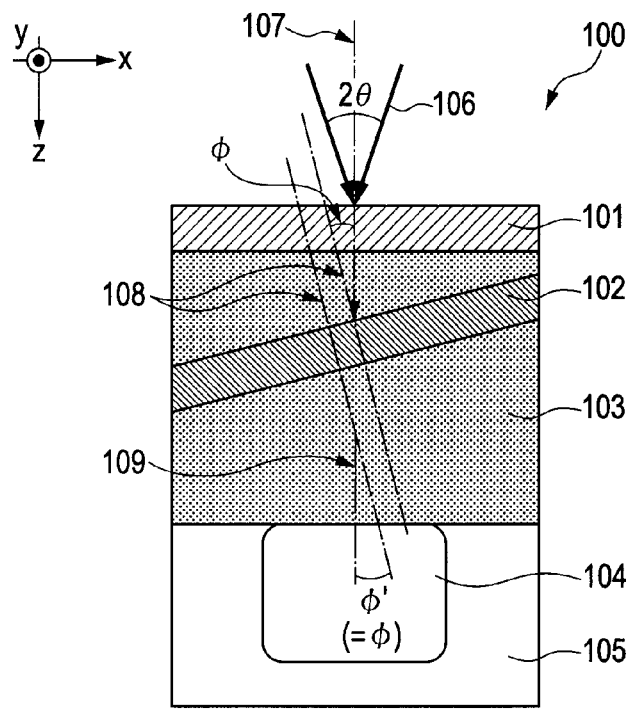
FIG. 1 is a schematic cross-sectional view illustrating the internal structure of a ranging pixel according to a first embodiment of the present invention.

FIG. 1 is a schematic cross-sectional view of a ranging pixel 100 of the first embodiment.

Pixel 100 of this embodiment includes a wavelength selective filter 101 that selectively transmits light having the wavelength to be used for ranging operations, a light-receiving section 103 having a guided mode resonant filter 102 in the inside and a silicon substrate 105 having a photoelectric conversion section 104 in the inside arranged in the above mentioned order as viewed from the light-receiving side (−z side) of the pixel.

The flux of light 106 that gets to the pixel 100 represents an angle of divergence 2θ and its principal ray 107 runs along the z-axis from the −z side toward the +z side.

The guided mode resonant filter 102 has a characteristic of reflecting light striking the guided mode resonant filter 102 perpendicularly along the normal line 108 for light having the wavelength to be used for ranging operations.

The normal line 108 of the guided mode resonant filter 102 is inclined by angle ø relative to the principal ray 107 of the incident flux of light 106.

Since both the principal ray 107 of the incident flux of light 106 and the normal line 109 of the silicon substrate 105 face the z-direction, the angle ø' formed by the normal line 109 of the silicon substrate 105 and the normal line 108 of the guided mode resonant filter 102 is equal to (the predetermined angle) ø.

Figure 2:
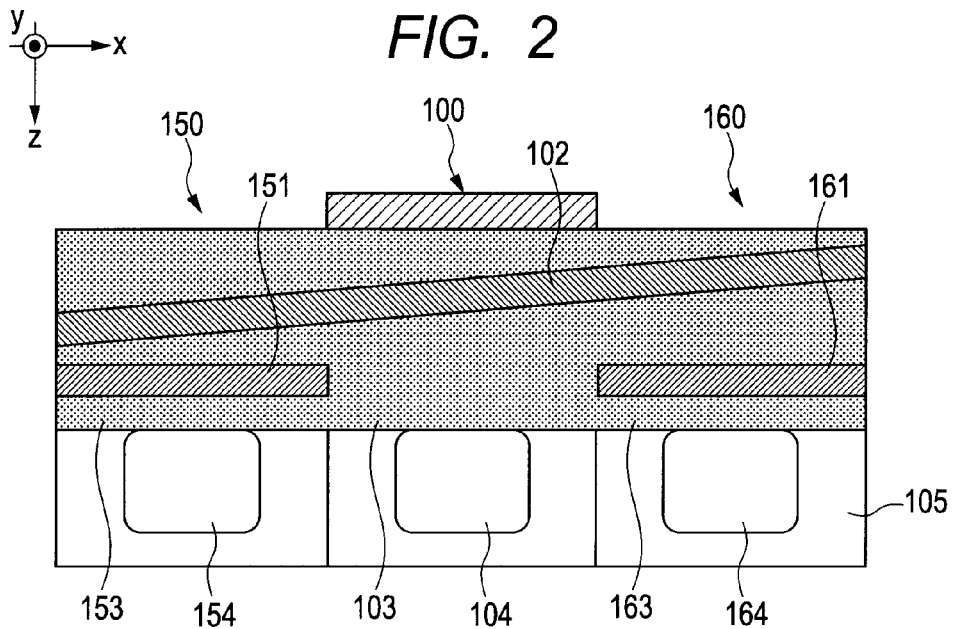
FIG. 2 is a schematic illustration of the structure of a ranging pixel and its vicinity according to the first embodiment of the present invention.

FIG. 2 is a schematic illustration of the structure of a ranging pixel and its vicinity.

As illustrated in FIG. 2, pixels 150, 160 that are next to ranging pixel 100 respectively include absorption filters 151, 161 arranged in the light-receiving sections 153, 163 at the +z side (at the side of the silicon substrate 105 having photoelectric conversion sections 154, 164 in the inside) relative to the guided mode resonant filter 102.

The absorption filters 151, 161 have a characteristic of absorbing light having the wavelength to be used for ranging operations.

When the normal line 108 of the guided mode resonant filter 102 is inclined relative to the principal ray 107 of the incident flux of light 106, the pixel can operate for high precision ranging for the reason that will be described below.

Figure 3:
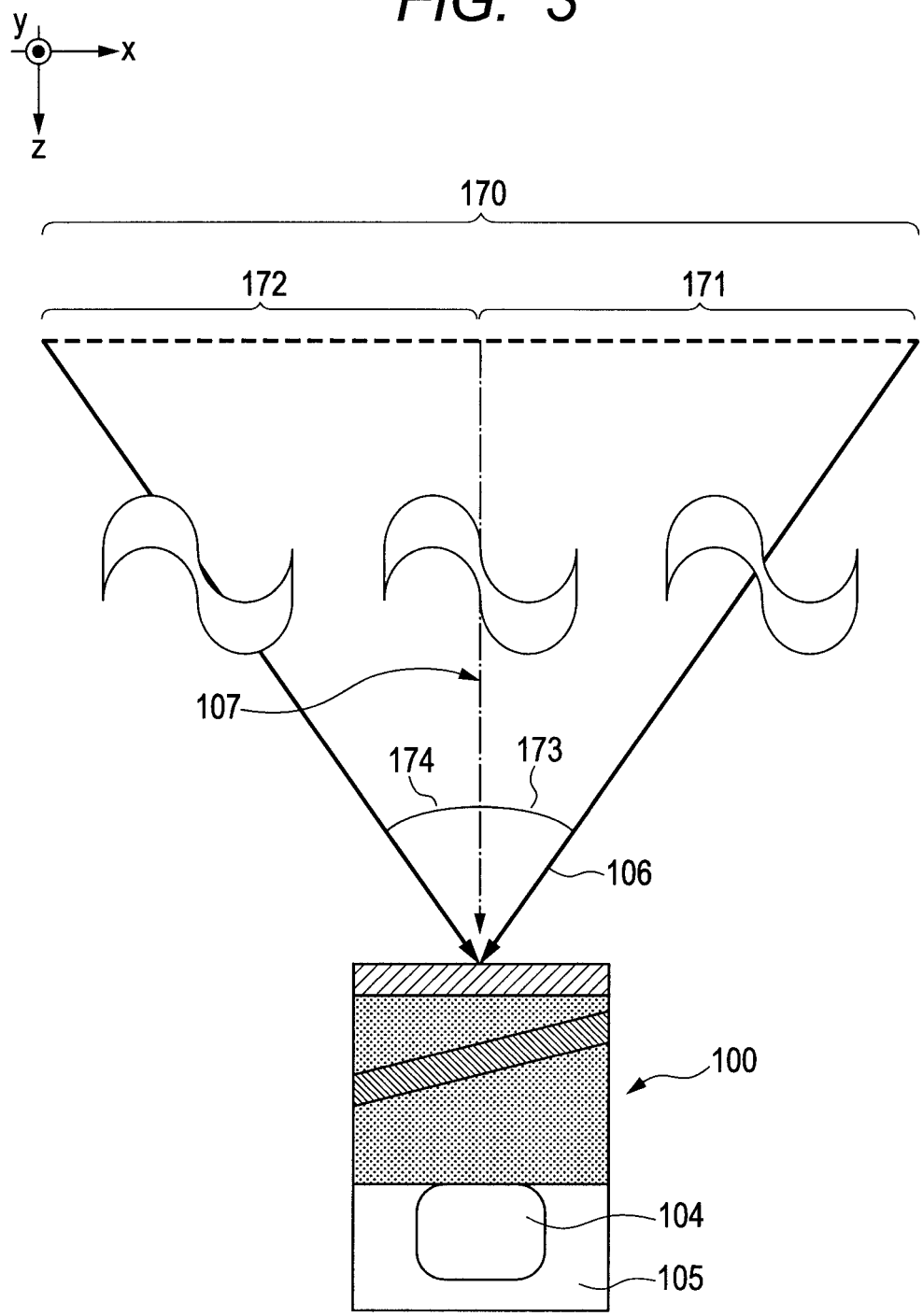
FIG. 3 is a schematic illustration of the relationship between the exit pupil of the camera lens and the rays of light entering a pixel according to the first embodiment of the present invention.

Firstly, the conditions that should be met for ranging by means of phase detection in the ranging pixel 100 will be described by referring to FIG. 3.

With phase detection, a ranging operation is conducted by comparing the quantity of light that passes a specific region 171 on the exit pupil 170 of the camera lens and the quantity of light that passes a region 172 arranged symmetrically relative to the region 171.

Since the exit pupil 170 of the camera lens is located sufficiently remote relative to the ranging pixel 100, light entering the pixel from the specific region 171 of the exit pupil 170 of the camera lens is perceived as light entering the pixel at incident angle 173.

Similarly, light from the region 172 is perceived as light entering at incident angle 174.

Therefore, only preparing a pixel for selectively detecting light entering at the incident angle 173 and a pixel for selectively detecting light entering at the incident angle 174 and comparing the outputs of the two pixels are sufficient for ranging operations.

In other words, selectively receiving light entering at a specific incident angle is required.

Now, the arrangement and the underlying principle of the guided mode resonant filter 102 will be described below.

Figure 4A:
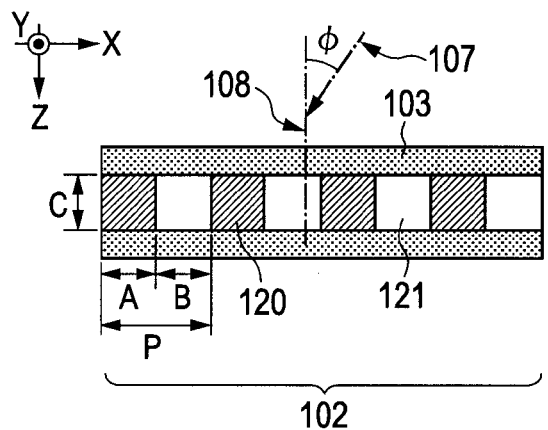
FIG. 4A is a schematic illustration of a guided mode resonant filter according to the first embodiment of the present invention.

FIG. 4A is a schematic cross-sectional view of the guided mode resonant filter 102. The Z-axis of FIG. 4A represents the direction that agrees with the normal line 108 of the guided mode resonant filter 102 (and hence the X- and Z-axes in FIGS. 4A through 4D are inclined by angle ø relative to the x- and z-axes in FIG. 1).

The guided mode resonant filter has such a structure that a high permittivity section 120 having a width A in the X-direction and a low permittivity section 121 having a width B in the X-direction are arranged at period P (=A+B) in the X-direction.

Figure 4B:
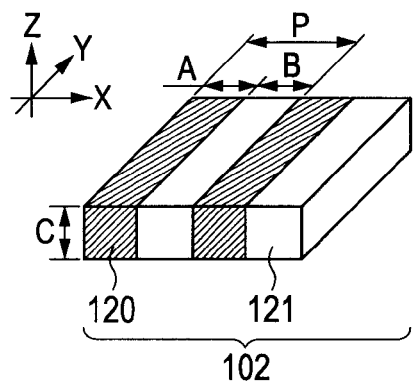
FIG. 4B is a schematic illustration of a guided mode resonant filter according to the first embodiment of the present invention.
Figure 4C:
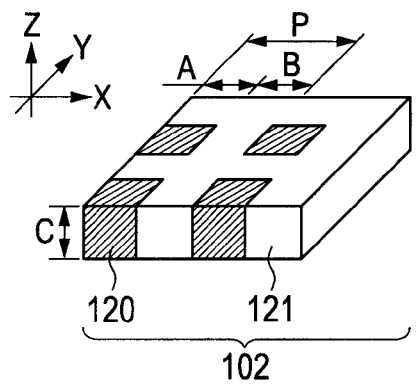
FIG. 4C is a schematic illustration of a guided mode resonant filter according to the first embodiment of the present invention.
Figure 4D:
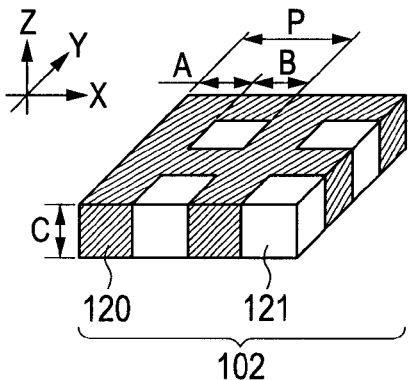
FIG. 4D is a schematic illustration of a guided mode resonant filter according to the first embodiment of the present invention.

The guided mode resonant filter may well represent a uniform permittivity distribution in the Y-direction as illustrated in FIG. 4B or a periodic distribution in the Y-direction as illustrated in FIG. 4C or FIG. 4D.

When light enters the guided mode resonant filter 102, resonance of the light and light having a wave number vector of a specific amplitude along the X-direction takes place because regions having different permittivities (high permittivity sections 120, low permittivity sections 121) are arranged periodically so that incident light is reflected.

The amplitude of the wave number vector in the X-direction varies as a function of the incident angle relative to the guided mode resonant filter, the guided mode resonant filter is provided with a characteristic of reflecting light striking the guided mode resonant filter at an angle that gives rise to resonance and transmitting light entering the guided mode resonant filter at an angle that does not give rise to resonance.

In FIG. 5, a guided mode resonant filter in which the angle that gives rise to resonance agrees with the Z-direction in FIG. 4A (the direction of the normal line 108 of the guided mode resonant filter 102) is employed and the direction of the normal line 108 is inclined by angle ø from the principal ray 107 of the incident flux of light.

Figure 5A:
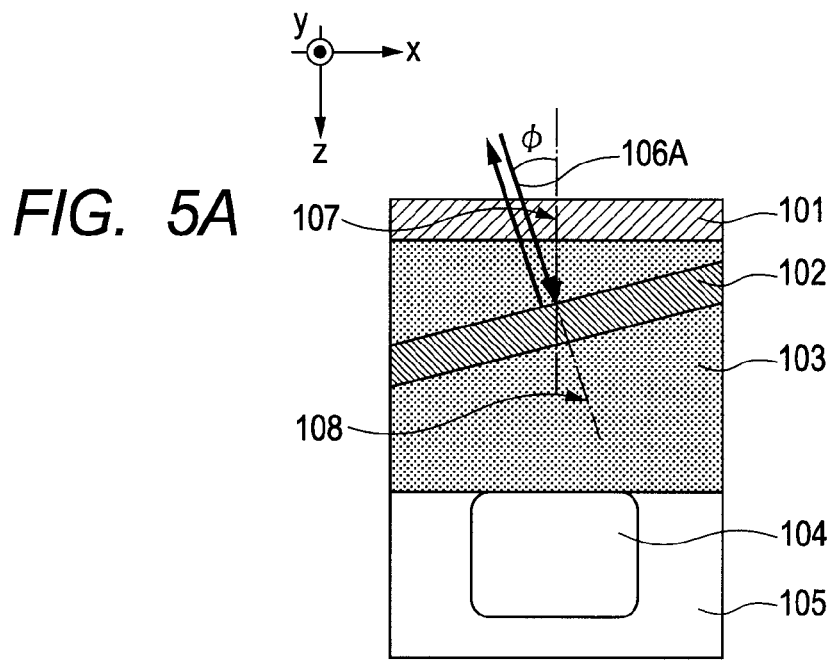
FIG. 5A is a schematic illustration of selective detection of incident light according to the first embodiment of the present invention.

Then, incident light 106A of an angle inclined counterclockwise by ø from the +z direction as viewed from the direction of +y strikes the guided mode resonant filter 102 from the Z-direction (in the direction of the normal line 108) and hence is reflected (FIG. 5A).

As described above, of the flux of light with an angle of divergence 2θ, only light 106A striking the guided mode resonant filter 102 at an angle inclined counterclockwise by angle ø is reflected.

Figure 5B:
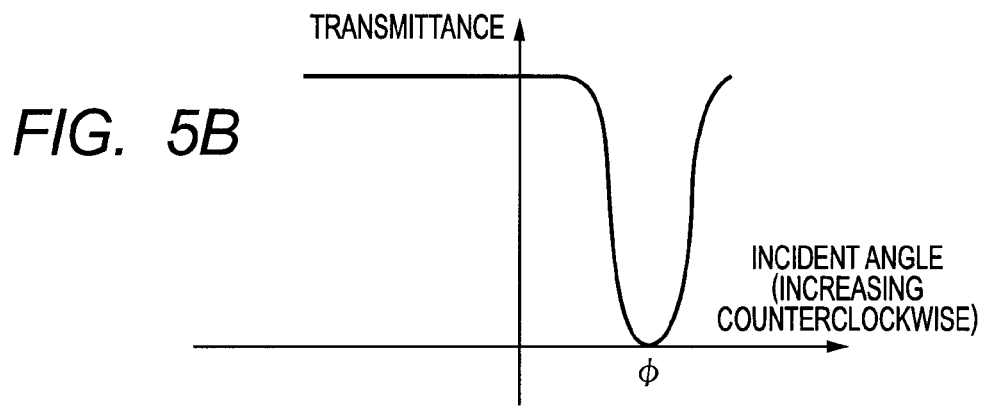
FIG. 5B is a schematic illustration of selective detection of incident light according to the first embodiment of the present invention.

Because the condition of resonance has a certain breadth in actuality, the guided mode resonant filter 102 represents a transmittance characteristic that represents a bottom of transmittance at the direction of angle ø of counterclockwise inclination that has a certain width as illustrated in FIG. 5B.

Figure 5C:
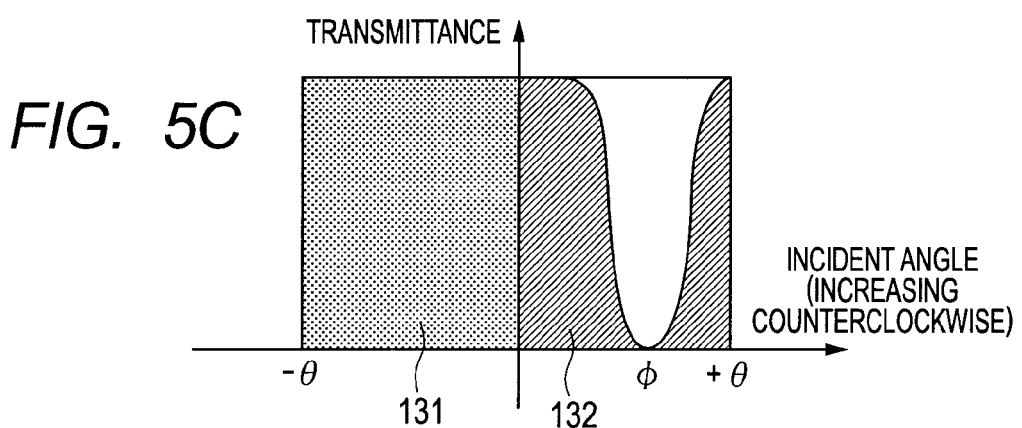
FIG. 5C is a schematic illustration of selective detection of incident light according to the first embodiment of the present invention.

The condition to be met for a ranging operation is that the transmittance of light striking the guided mode resonant filter 102 at an angle inclined clockwise (the area of region 131) is greater than the transmittance of light striking the guided mode resonant filter 102 at an angle inclined counterclockwise (the area of region 132) as illustrated in FIG. 5C.

Since the transmittance of light striking the guided mode resonant filter 102 at an angle inclined counterclockwise is reduced at and near angle ø, light striking the guided mode resonant filter 102 at an angle inclined clockwise can be selectively received.

Preferably, the angle ø formed by the normal line 108 of the guided mode resonant filter 102 and the principal ray 107 of the incident flux of light 106 is not greater than a half (θ) of the angle of divergence (2θ) of the incident flux of light 106.

This is because the bottom of transmittance is found within the angle of divergence of the incident flux of light and hence light striking the guided mode resonant filter 102 at an angle inclined counterclockwise can be reflected efficiently when the angle ø is made not greater than a half of the angle of divergence.

Figures 6A, 6B:
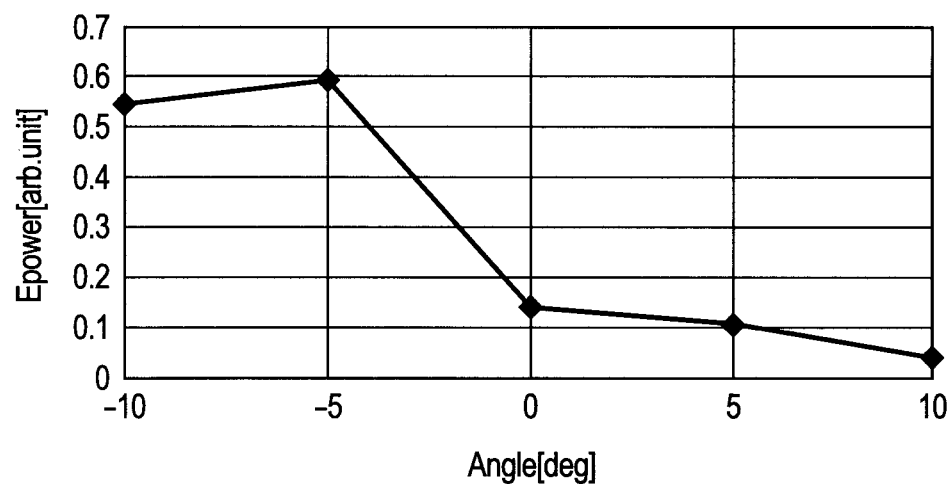
FIG. 6A is a schematic illustration of the incident light detection characteristic of a ranging pixel according to the first embodiment of the present invention.
FIG. 6B is a schematic illustration of the incident light detection characteristic of a ranging pixel according to the first embodiment of the present invention.

FIG. 6A illustrates the incident angle dependency of the electric field intensity in the photoelectric conversion section obtained by electromagnetic field computations.

In the graph of FIG. 6A, the horizontal axis indicates the incident angle, the counterclockwise direction being the position direction, and the vertical axis indicates the electric field intensity. The pixels 100, 150 and 160 have a width of 1.4 µm in the x-direction and the structural parameters (A, B, C, ∈1, ∈2, ∈3) of the guided mode resonant filter 102 are the same as those illustrated in FIG. 6B.

Note that the specific permittivity of the high permittivity section 120 is ∈1 and the specific permittivity of the low permittivity section 121 is ∈2, while the specific permittivity of the neighboring light-receiving section 103 of the guided mode resonant filter 102 is ∈3.

The height of the guided mode resonant filter in the Z-direction is C. The guided mode resonant filter 102 represents a uniform permittivity distribution in the Y-direction and the wavelength of light to be used for ranging operations is 546 nm.

The incident flux of light 106 strikes the guided mode resonant filter with its principal ray 107 directed in the +z direction and an angle of diversion (2θ) of 20°.

The angle (ø) formed by the normal line 108 of the guided mode resonant filter 102 and the normal line 109 of the surface of the silicon substrate 105 is 5°.

As illustrated in FIG. 6A, light 106A inclined counterclockwise by 5° is transmitted only by 11%, whereas light 106B inclined clockwise by 5° is transmitted by 59%.

Therefore, the guided mode resonant filter 102 selectively receives light 106B that is inclined clockwise to make a ranging operation using phase detection feasible.

As described above, a guided mode resonant filter 102 adapted to reflect light striking it at a specific incident angle (0°) is employed and the guided mode resonant filter 102 is arranged such that the normal line 108 thereof is inclined (by angle ø) relative to the principal ray 107 of the flux of light 106 striking the guided mode resonant filter 102.

With this arrangement, of the incident flux of light 106, light (106B) striking the guided mode resonant filter at a specific angle is selectively received to realize a high precision ranging operation.

Generally for each pixel located near the center of a solid state image sensor, the principal ray 107 of the incident flux of light 106 agrees with the direction of the normal line 109 of the silicon substrate 105 as illustrated in FIG. 1. Therefore, high precision ranging operations can be realized by arranging the guided mode resonant filter with the normal line thereof inclined by a predetermined angle (ø') relative to the light-receiving surface of the substrate.

While a guided mode resonant filter 102 in which the angle for giving rise to resonance agrees with the Z-direction is employed in the instance of FIG. 1, a guided mode resonant filter in which the angle for giving rise to resonance is inclined from the Z-direction may alternatively be employed.

For example, in the case of a guided mode resonant filter 112 adapted to give rise to resonance in a direction inclined by 2ø from the Z-direction, light 106B striking the guided mode resonant filter 112 at an angle inclined clockwise by ø satisfies the condition of resonance and hence is reflected.

Thus, the guided mode resonant filter 112 can selectively receive light striking at an angle inclined counterclockwise. This condition is met by using a guided mode resonant filter having structural parameters as illustrated in FIG. 6B and light having a wavelength of 674 nm for ranging operations.

Figures 7A, 7B:
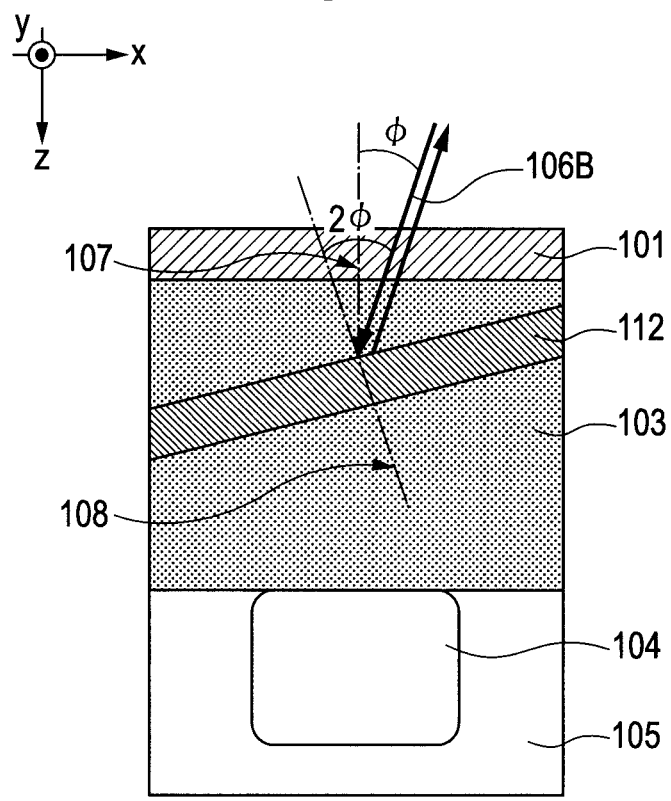
FIG. 7A is a schematic illustration of selective detection of incident light according to the first embodiment of the present invention.
FIG. 7B is a schematic illustration of selective detection of incident light according to the first embodiment of the present invention.

Alternatively, the structural parameters may be switched to those listed in FIG. 7B, while using the wavelength of light of 546 nm for ranging operations.

Note, however, the use of a guided mode resonant filter 102 adapted to reflect light striking in a direction parallel to the direction of the normal line 108 of the guided mode resonant filter is preferable relative to the use of a guided mode resonant filter 112 adapted to reflect light striking in a direction inclined from the Z-direction because the former provides a higher level of ranging precision.

This is for the reason as described below. The symmetry of the periodical arrangement of a guided mode resonant filter is best for light striking from the Z-direction.

Therefore, resonance of a guided mode resonant filter and light striking from the Z-direction is stronger than resonance of the guided mode resonant filter and light striking from a direction deviated from the Z-direction.

As a result, a guided mode resonant filter 102 adapted to resonate with light striking from the Z-direction provides a broader range of wavelength, that makes the angle selecting characteristic, than a guided mode resonant filter 112 adapted to resonate with light striking from a direction deviated from the Z-direction.

Thus, the guided mode resonant filter 102 can more advantageously be used for ranging operations with regard to light having a broad wavelength range than the guided mode resonant filter 112.

Since the precision of a ranging operation is determined by the quantity of light entering a guided mode resonant filter, the guided mode resonant filter 102 represents a higher level of precision than the guided mode resonant filter 112.

While a wavelength selective filter 101 that selectively transmits light having the wavelength to be used for ranging operations is arranged at the light-receiving side of the ranging pixel 100 in FIG. 1, the wavelength selective filter may be omitted for the purpose of the present invention.

Note, however, the use of a wavelength selective filter 101 is preferable because such a wavelength selective filter prevents light of wavelengths other than the wavelength to be used for a ranging operation from entering over the entire angle of divergence of the incident flux of light and hence operates for a further improvement of ranging precision.

The use of a wavelength that raises the luminance of a subject is preferable for a ranging operation because the ranging precision is improved by the use of such a wavelength.

As far as an ordinary subject is concerned, the use of light having a wavelength of about 550 nm is preferable for ranging operations because the subject represents a high luminance for light having a wavelength of about 550 nm.

While absorption filters 151, 161 that absorb light having the wavelength to be used for ranging operations are arranged in the respective pixels 150, 160 neighboring the ranging pixel 100 in FIG. 2, such absorption filter may not necessarily be arranged for the purpose of the present invention.

However, the use of absorption filters 151, 161 is preferable because the quantity of light detected by the neighboring pixels 150, 160 is reduced out of the light that enters the ranging pixel 100 when absorption filters 151, 161 are arranged.

The absorption filters 151, 161 have a wavelength selecting property of absorbing light having the wavelength to be used for ranging operations but not absorbing light having wavelengths to be detected by the pixels 150, 160. As specific examples, a pigment or a metal may be employed.

Figure 8:
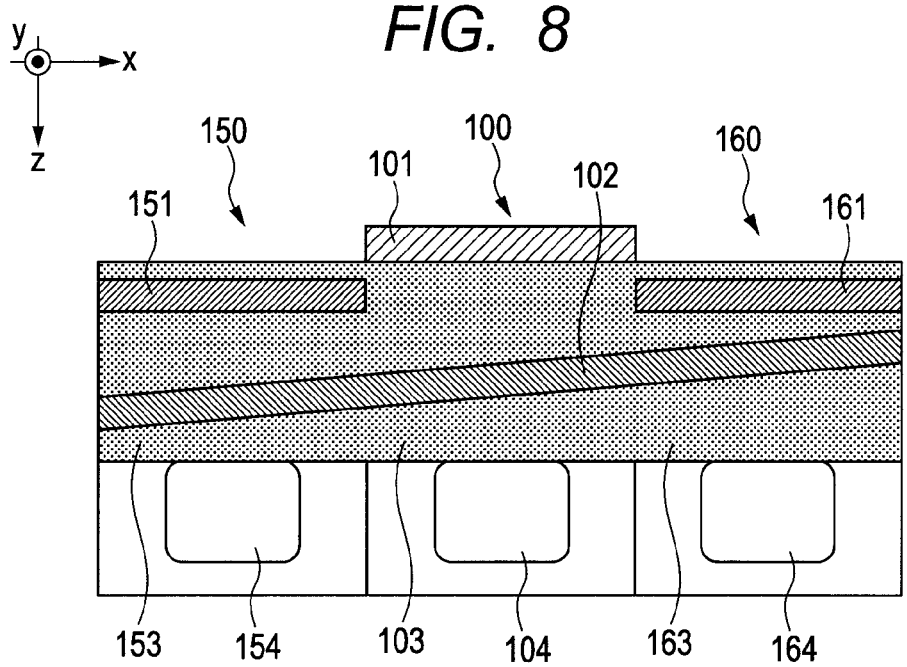
FIG. 8 is another schematic illustration of the structure of a ranging pixel and its vicinity according to the first embodiment of the present invention.

The absorption filters 151, 161 may alternatively be arranged at the light-receiving side relative to the guided mode resonant filter 102 as illustrated in FIG. 8.

However, the absorption filters 151, 161 are preferably arranged between the guided mode resonant filter 102 and the silicon substrate 105 as illustrated in FIG. 2.

This is because they can absorb light transmitted through the guided mode resonant filter 102 at respective positions close to the photoelectric conversion sections 154, 164 of the neighboring pixels.

Figure 9:
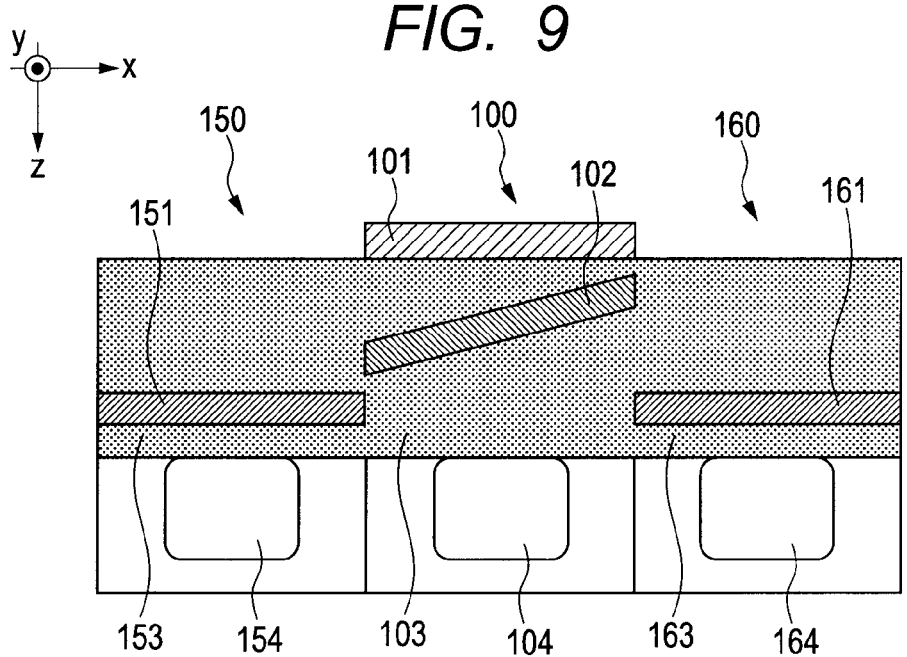
FIG. 9 is still another schematic illustration of the structure of a ranging pixel and its vicinity according to the first embodiment of the present invention.

While the guided mode resonant filter 102 is arranged across a plurality of pixels (pixel 150, pixel 100, pixel 160) including the ranging pixel 100 in FIG. 2, the guided mode resonant filter 102 may well be arranged only in the ranging pixel 100 (FIG. 9).

Note, however, that the guided mode resonant filter 102 is preferably arranged across a plurality of pixels because such an arrangement makes the angle selecting characteristic of the guided mode resonant filter 102 an excellent one.

This is because, when the guided mode resonant filter 102 is arranged across a plurality of pixels, the number of periods of the periodic arrangement of the guided mode resonant filter 102 is increased to intensify the resonance of the incident flux of light 106 and the guided mode resonant filter 102.

In the case of a focus detection pixel as illustrated in FIG. 1, the principal ray 107 of the incident flux of light 106 is directed to the +z direction (the direction of the normal line 109 of the silicon substrate surface 105). Then, light can enter the neighboring pixels with the principal ray 107 inclined from the +z direction.

Figure 10:
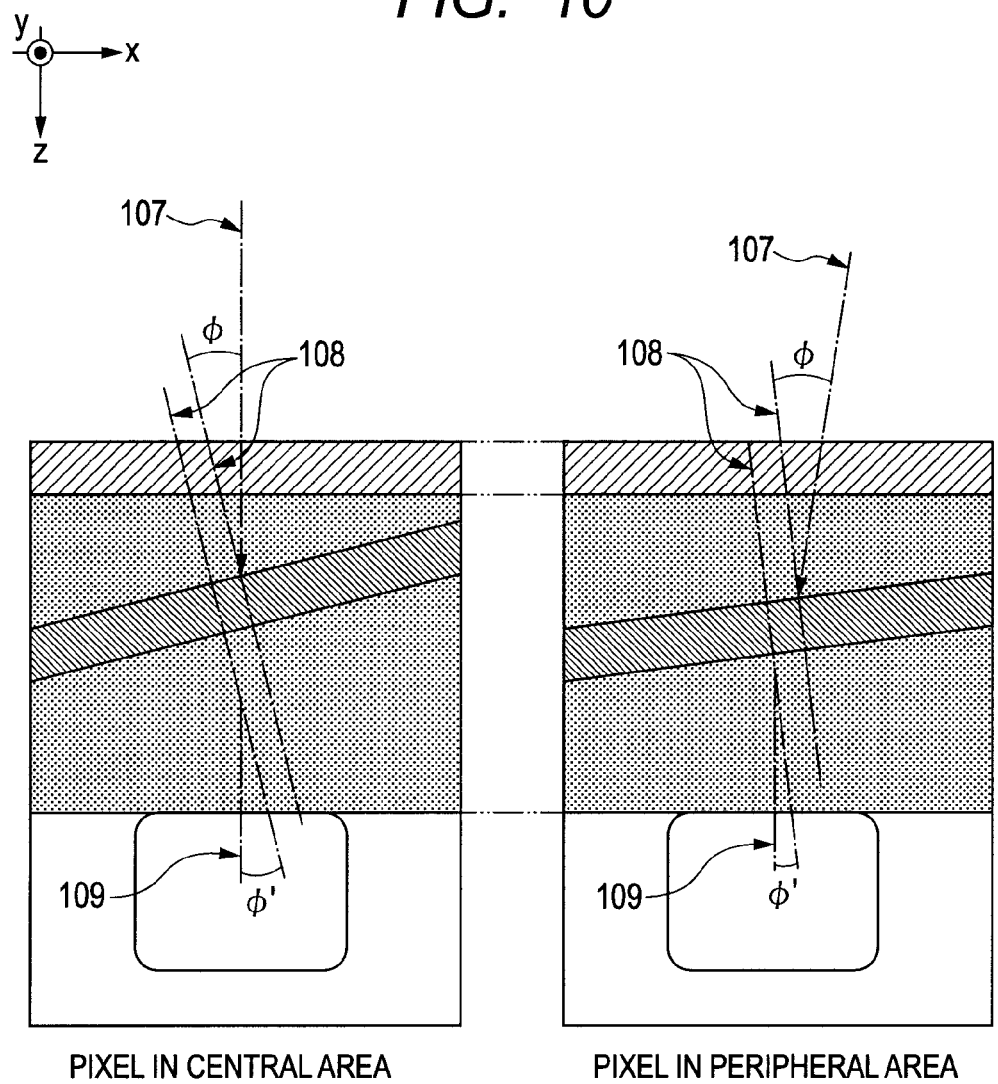
FIG. 10 is a schematic illustration of the structure of a plurality of ranging pixels according to the first embodiment of the present invention.

If such is the case, the angle ø' (predetermined angle) formed by the normal line 108 of the guided mode resonant filter and the normal line 109 of the silicon substrate is preferably varied on a pixel by pixel basis in order to make the angle formed by the principal ray 107 of the incident flux of light and the normal line 108 of the guided mode resonant filter represent a constant value (FIG. 10).

This is because of the following reason. The resonance condition of a guided mode resonant filter is determined by the incident angle of light relative to the guided mode resonant filter.

Therefore, when the angle (ø) formed by the principal ray 107 of the incident flux of light and the normal line 108 of the guided mode resonant filter is made to represent a constant value, the pixels are made to commonly have the same resonance condition (that is the incident angle of light that gives rise to resonance out of the incident flux of light).

Then, as a result, the same guided mode resonant filter can be adopted for a plurality of focus detection pixels so that a solid state image sensor can be manufactured with ease.

In this embodiment, a plurality of pixels can be arranged in a manner as described below. Namely, a pair of ranging pixels, of which both the normal lines of the guided mode resonant filters and the angles of inclination of the principal rays of the fluxes of light striking the respective guided mode resonant filters agree with each other but the senses of inclination are opposite relative to each other, are provided. Then, this arrangement can be made to output a ranging signal, using the signals from the paired ranging pixels.

Now, a method of manufacturing the solid state image sensor of this embodiment will be described below by referring to FIGS. 11A through 11H.

Figure 11A:
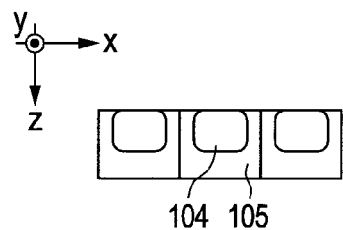
FIG. 11A is a schematic illustration of the method of manufacturing the solid state image sensor according to the first embodiment of the present invention.

Firstly, ions are implanted into predetermined positions of a silicon substrate 105 to prepare photoelectric conversion sections 104 (FIG. 11A).

Figure 11E:
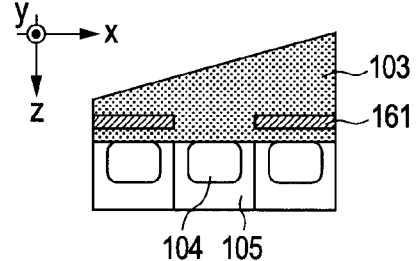
FIG. 11E is a schematic illustration of the method of manufacturing the solid state image sensor according to the first embodiment of the present invention.
Figure 11B:
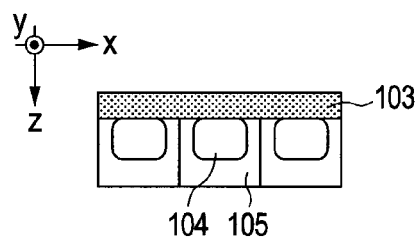
FIG. 11B is a schematic illustration of the method of manufacturing the solid state image sensor according to the first embodiment of the present invention.

Then, after arranging a wiring layer and gate electrodes that are necessary, a light-receiving section 103 is formed for each pixel by using an $SiO_2$ layer, which is then subjected to a planarizing process typically by means of CMP (FIG. 11B).

Figure 11F:
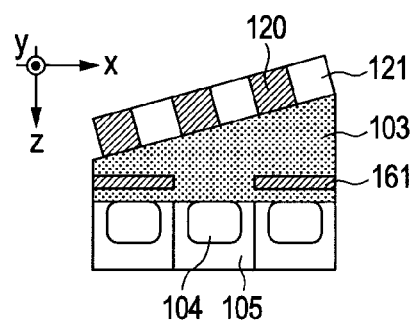
FIG. 11F is a schematic illustration of the method of manufacturing the solid state image sensor according to the first embodiment of the present invention.
Figure 11C:
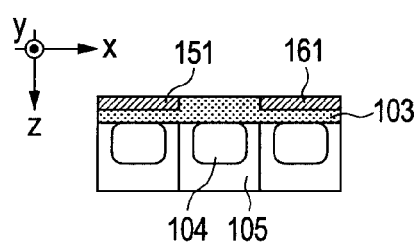
FIG. 11C is a schematic illustration of the method of manufacturing the solid state image sensor according to the first embodiment of the present invention.

Subsequently, absorption filters 151, 161 are prepared for pixels 150, 160 typically by applying a pigment, while pixel 100 is planarized by way of the $SiO_2$ layer (FIG. 11C).

Figure 11G:
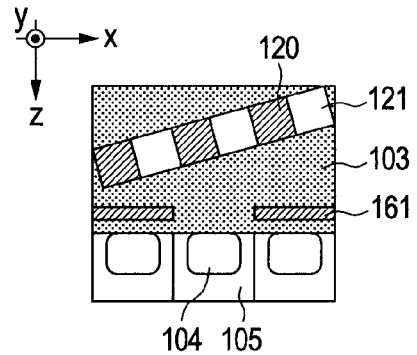
FIG. 11G is a schematic illustration of the method of manufacturing the solid state image sensor according to the first embodiment of the present invention.
Figure 11D:
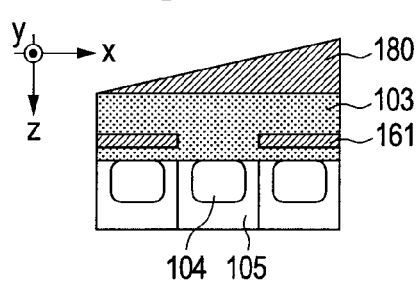
FIG. 11D is a schematic illustration of the method of manufacturing the solid state image sensor according to the first embodiment of the present invention.

Thereafter, a sacrifice layer 180 having a film thickness continuously increasing from the −x direction toward the +x direction is prepared by lithography and a dry etching operation is conducted thereon (FIG. 11D).

Note that the obtained result will be so much better when the sacrifice layer 180 does not perfectly withstand etching gas.

Thin parts of the sacrifice layer are etched out in a short period of time, whereas the $SiO_2$ layer is left unetched to represent a large thickness at thick parts of the sacrifice layer 180 (FIG. 11E).

Then, a high permittivity section 120 and a low permittivity section 121 are arranged periodically on the inclined surface of the $SiO_2$ layer typically by means of lithography and deposition to form guided mode resonant filters (FIG. 11F).

At this time, the high permittivity sections and the low permittivity sections are only required to represent desired respective permittivities. Therefore, a combination of $TiO_2$ and $SiO_2$ may well be employed for this purpose.

After depositing $SiO_2$, a sacrifice layer 181 having a film thickness continuously increasing from the +x direction toward the −x direction is prepared and a subsequently dry etching operation is conducted thereon.

Thin parts of the sacrifice layer are etched out in a short period of time, whereas the $SiO_2$ layer is left unetched to represent a large thickness at thick parts of the sacrifice layer 181, similar to the step in FIG. 11D.

Thereafter, a planarized light-receiving section 103 is formed typically by means of CMP (FIG. 11G).

Figure 11H:
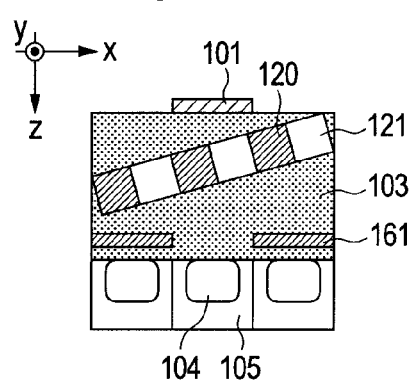
FIG. 11H is a schematic illustration of the method of manufacturing the solid state image sensor according to the first embodiment of the present invention.
Figure 12:
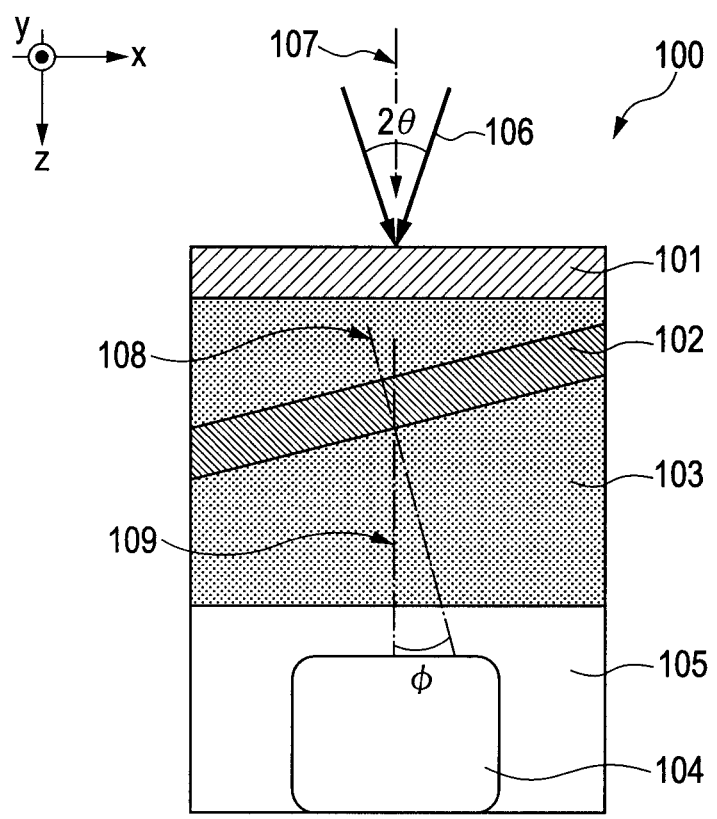
FIG. 12 is a schematic illustration of the internal structure of a ranging pixel according to the first embodiment of the present invention.

Finally, a wavelength selective filter 101 is formed typically by applying a pigment to produce a ranging pixel 100. In this way, a solid state image sensor is manufactured (FIG. 11H).

While the light-receiving section 103 is planarized in this embodiment, the light-receiving section 103 may not necessarily be planarized. However, the light-receiving section 103 is preferably planarized because, if the light-receiving section 103 is not planarized and steps are produced among pixels, scattered light can be produced from the steps to give rise to cross talks and losses of light.

Note that, while this embodiment is realized as a front surface-illuminated-type solid state image sensor, where light enters from the side from which ions are implanted into the silicon substrate to prepare photoelectric conversion sections 104, a solid state image sensor according to the present invention may not necessarily be a front surface-illuminated-type solid state image sensor.

In other words, a solid state image sensor according to the present invention may be a rear surface-illuminated-type solid state image sensor where light enters from the side from which no ions are implanted into the silicon substrate.

Second Embodiment

The second embodiment of a solid state image sensor having a configuration different from the above-described first embodiment will be described below.

Figure 13:
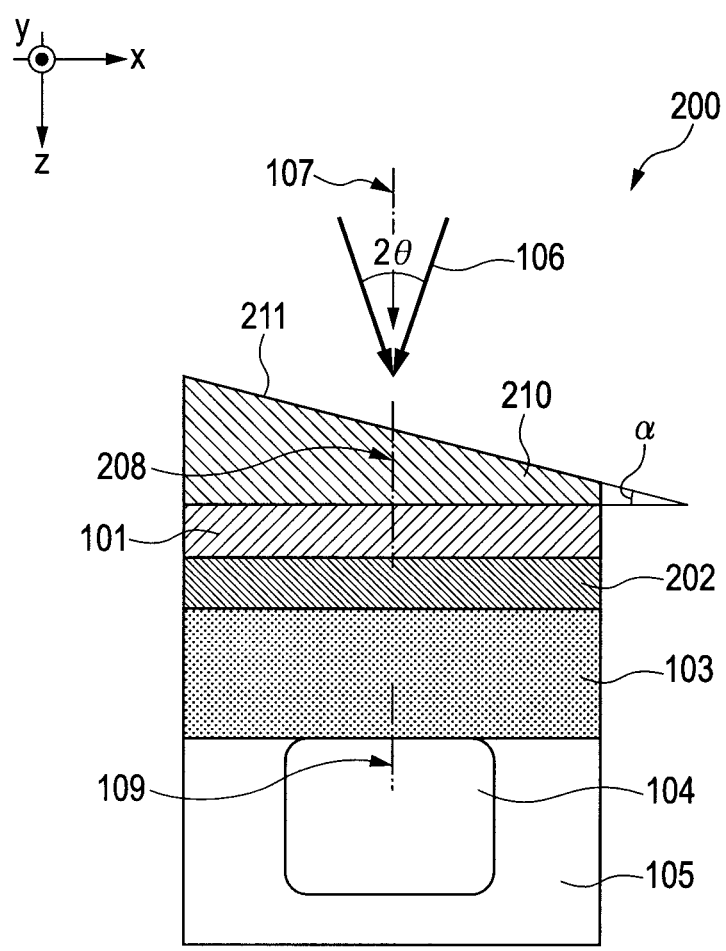
FIG. 13 is another schematic illustration of the internal structure of a ranging pixel according to a second embodiment of the present invention.

As seen from FIG. 13, a solid state image sensor 200 of this embodiment differs from the solid state image sensor of the first embodiment in terms of characteristic and arrangement of a guided mode resonant filter 202 and also in that a deflecting element 210 is arranged at the light-receiving side relative to the guided mode resonant filter 202.

Figure 14:
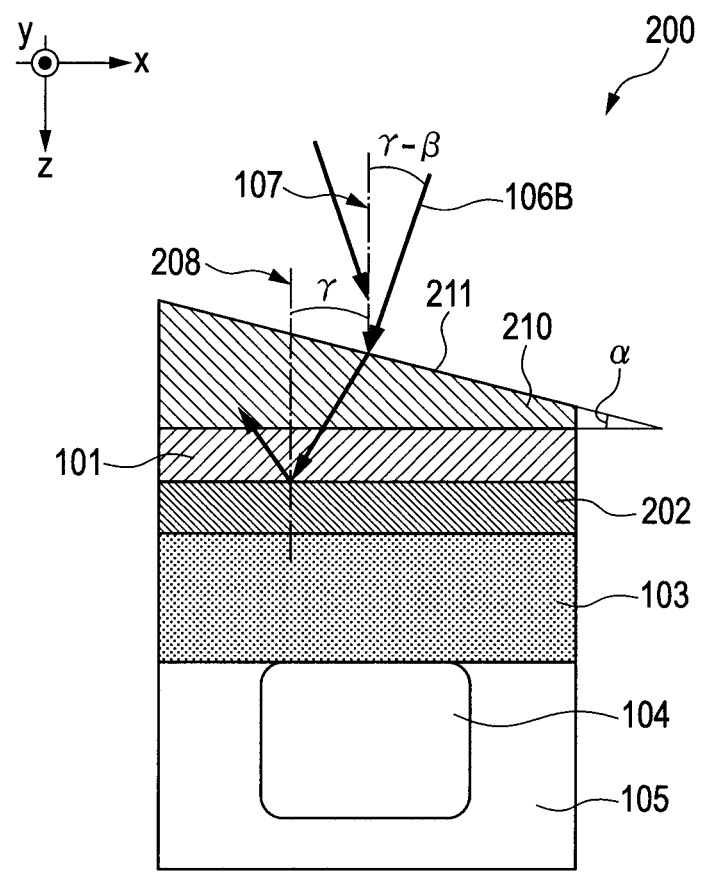
FIG. 14 is a schematic illustration of selective detection of incident light according to the second embodiment of the present invention.

As illustrated in FIG. 14, the guided mode resonant filter 202 is so configured as to represent a characteristic of reflecting incident light inclined by angle γ (predetermined angle of reflection) from the normal line 208 of the guided mode resonant filter 202 with regard to light having the wavelength to be used for ranging operations.

The guided mode resonant filter 202 is so arranged as to make its normal line 208 agree with the normal line 109 of the silicon substrate 105.

The deflecting element 210 has a surface 211 (deflecting surface) inclined by angle α relative to the light-receiving surface (xy surface) of the silicon substrate 105 and has a characteristic of deflecting the principal ray 107 of the incident flux of light 106 by angle β (predetermined angle of deflection).

High precision ranging operation can be realized for the reason described below when a deflecting element 210 as described above is arranged relative to the guided mode resonant filter 202 having the above-described configuration. As described above for the first embodiment, selectively receiving light entering at a specific incident angle is sufficient for ranging operations.

Light entering the second embodiment at a specific angle can be selectively received by means of the guided mode resonant filter 202 and the deflecting element 210 as will be described below.

Referring to FIG. 14, light 106B inclined clockwise from the +z direction (the direction of the center line 107 of the incident flux of light) by angle γ−β enters in the direction inclined by angle γ from the direction of the normal line 208 relative to the guided mode resonant filter 202 and hence is reflected, satisfying the condition of resonance (FIG. 14).

Therefore, the transmittance of light inclined clockwise and entering the second embodiment is smaller than the transmittance of light inclined counterclockwise and entering the second embodiment so that light inclined counterclockwise and entering the second embodiment can be selectively detected.

Figures 15A, 15B:
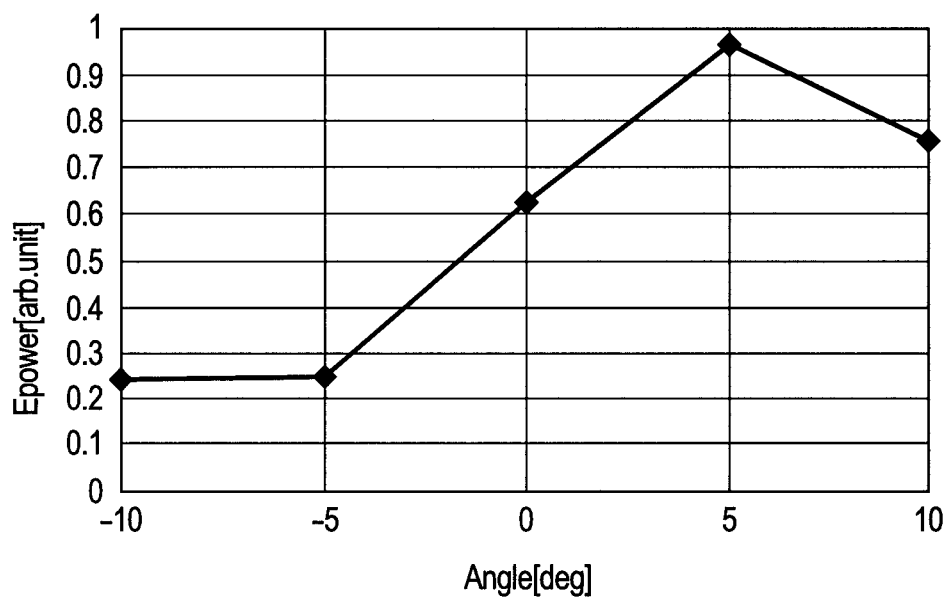
FIG. 15A is a schematic illustration of the incident light detection characteristic of a ranging pixel according to the second embodiment of the present invention.
FIG. 15B is a schematic illustration of the incident light detection characteristic of a ranging pixel according to the second embodiment of the present invention.

FIG. 15A illustrates the incident angle dependency of the electric field intensity in the photoelectric conversion section obtained by electromagnetic field computations.

In the graph of FIG. 15A, the horizontal axis indicates the incident angle, the counterclockwise direction being the positive direction, and the vertical axis indicates the electric field intensity. The pixels 200, 150 and 160 have a width of 1.4 μm in the x-direction.

The structural parameters (A, B, C, ∈1, ∈2, ∈3) of the guided mode resonant filter 202 and also the structural parameters (vertex angle α, permittivity ∈4) of the deflecting element 210 are the same as those illustrated in FIG. 15B.

The guided mode resonant filter 202 represents a uniform permittivity distribution in the Y-direction and the wavelength of light to be used for ranging operations is 674 nm. The flux of light 106 strikes the guided mode resonant filter with its principal ray 107 directed in the +z direction and an angle of diversion (2θ) of 20°.

As illustrated in FIG. 15A, light inclined counterclockwise by 5° is transmitted by 96%, whereas light inclined clockwise by 5° is transmitted only by 25%.

Therefore, the guided mode resonant filter 202 selectively receives light that is inclined counterclockwise to make a ranging operation using phase detection feasible.

For the above computations, the structural parameters of the guided mode resonant filter 202 and those of the deflecting element 210 are so designed as to make angle β (predetermined angle of deflection) and angle γ (predetermined angle of reflection) respectively equal to 5° and 10°.

As described above, the direction of the principal ray 107 of the incident flux of light 106 is bent by a predetermined angle of deflection (β) and the principal ray is inclined relative to the normal line 208 of the guided mode resonant filter 202.

With this arrangement, of the incident flux of light 106, light striking the guided mode resonant filter at a specific angle is selectively received to realize a high precision ranging operation.

While a guided mode resonant filter 202 in which the angle for giving rise to resonance is inclined from the Z-direction (direction of the normal line 208) by angle γ is employed in FIG. 14, a guided mode resonant filter 212 in FIG. 16A in which the angle for giving rise to resonance agrees with the Z-direction may alternatively be employed.

In such a case, light 106A striking the guided mode resonant filter 212 inclined counterclockwise by β from the direction of the principal ray 106 of the incident flux of light is reflected due to resonance (FIG. 16A).

Therefore, the guided mode resonant filter can selectively receive light inclined clockwise and striking it. To satisfy this condition, a resonance filter having structural parameters as listed in FIG. 15B may well be employed with light having a wavelength of 546 nm for ranging operations.

Alternatively, the structural parameters as listed in FIG. 16B may be employed with light having the above specified wavelength of 674 nm unchanged for ranging operations.

Note, however, the use of a guided mode resonant filter 212 adapted to reflect light striking in a direction parallel to the direction of the normal line 108 of the guided mode resonant filter is preferable such a guided mode resonant filter can be used for ranging operations with a broader range of wavelength of light.

Then, the ranging precision is advantageously improved.

The angle β (predetermined angle of deflection) by which the principal ray 107 is bent by the deflecting element 210 is preferably not greater than a half (θ) of the angle of divergence (2θ) of the incident flux of light 106.

This is because the bottom of transmittance is found within the angle of divergence of the incident flux of light and hence light striking the guided mode resonant filter at an angle inclined counterclockwise can be reflected efficiently (FIG. 16C).

On the other hand, the use of a guided mode resonant filter 202 adapted to reflect light inclined by angle γ (predetermined angle of reflection) from the direction (Z-direction) of the normal line 208 of the guided mode resonant filter and a deflecting element 210 producing a bent angle of β smaller than a half (θ) of the angle of divergence (2θ) of the incident flux of light provides the following advantage. The advantage is that the quantity of light detected by the neighboring pixels 150, 160 is reduced out of the light that enters the ranging pixel 100.

The reason for this is that, when a guided mode resonant filter 212 in which the angle for giving rise to resonance is directed in the Z-direction is employed, light 106B striking the guided mode resonant filter 212 at an angle inclined clockwise from the +z direction is transmitted through the guided mode resonant filter 212.

Therefore, the transmitted flux of light that strikes the silicon substrate 105 is inclined from the normal line 109 of the silicon substrate 105 (FIG. 16D).

Therefore, the ratio of the quantity of light detected by the neighboring pixels out of the light transmitted through the guided mode resonant filter 212 becomes high.

On the other hand, when a guided mode resonant filter 202 in which the angle for giving rise to resonance is inclined by angle γ from the Z-direction is employed, light 106A striking the guided mode resonant filter 202 at an angle inclined counterclockwise is transmitted through the guided mode resonant filter 202.

Figure 17A:
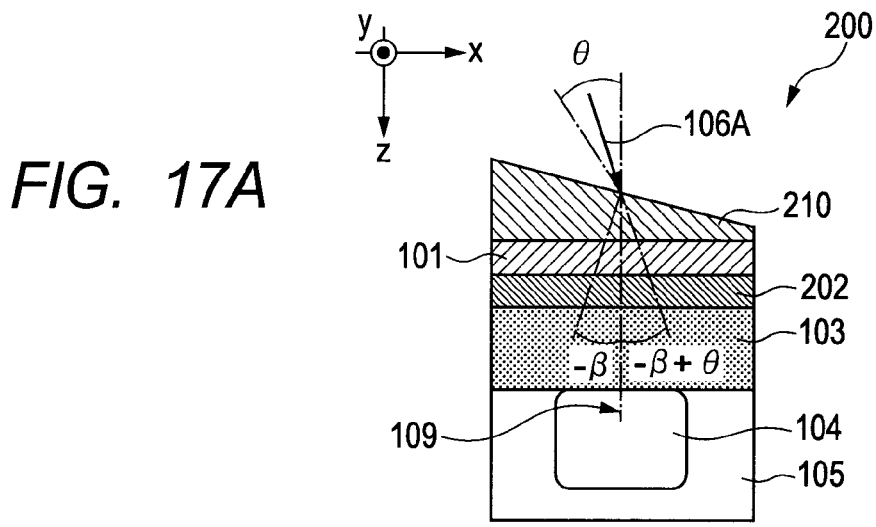
FIG. 17A is a schematic illustration of the characteristic of a guided mode resonant filter according to the second embodiment of the present invention.

Light inclined counterclockwise and striking the guided mode resonant filter 202 is bent by angle β by the deflecting element 210 and hence strikes the silicon substrate 105 at an inclined angle within a range between angle −β and angle −β+θ, the counterclockwise direction from the +z axis being the positive direction (FIG. 17A).

At this time, a part of the transmitted flux of light strikes the silicon substrate 105 along the normal line 109 thereof when the condition of −β<0<−β+θ is satisfied. Therefore, the quantity of light detected by the neighboring pixels is small out of the light transmitted through the guided mode resonant filter 202.

Since the inequality formula of −β<0<−β+θ is equivalent to 0<β<θ, it will be understood that the quantity of light detected by the neighboring pixels is small when the angle β (predetermined angle of deflection) by which the principal ray is bent by the deflecting element 210 is not greater than a half (θ) of the angle of divergence (2θ) of the incident flux of light.

When a guided mode resonant filter 202 in which the angle for giving rise to resonance is inclined by angle γ from the Z-direction is employed, the difference between the angle γ (predetermined angle of reflection) and the angle β (predetermined angle of deflection) by which the principal ray is bent by the deflecting element 210 is not greater than a half (θ) of the angle of divergence (2θ) of the incident flux of light.

Figure 17B:
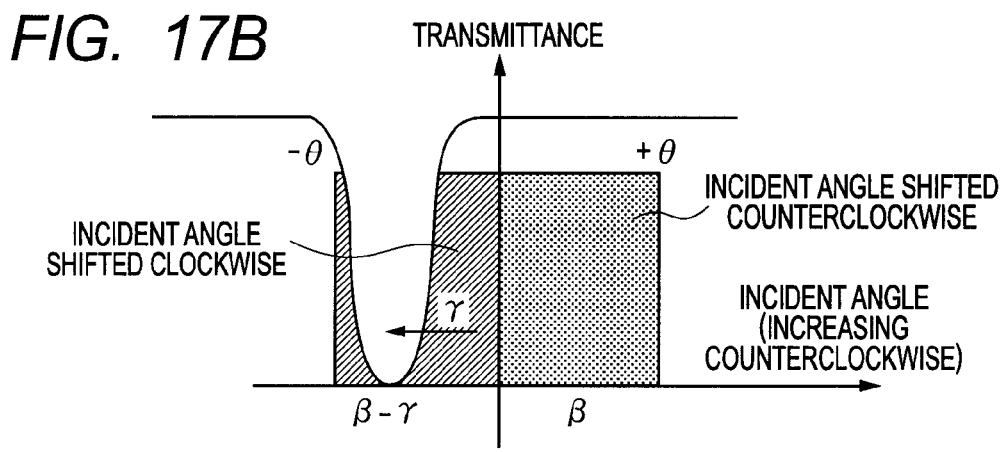
FIG. 17B is a schematic illustration of the characteristic of a guided mode resonant filter according to the second embodiment of the present invention.

This is because one of the bottoms of transmittance is found within the range of divergence of the incident flux of light that is inclined clockwise, light inclined clockwise and striking the guided mode resonant filter can be reflected efficiently (FIG. 17B).

Additionally, the sum of the angle γ (predetermined angle of reflection) and the angle β (predetermined angle of deflection) is preferably not smaller than a half (θ) of the angle of divergence (2θ) of the incident flux of light.

Figure 17C:
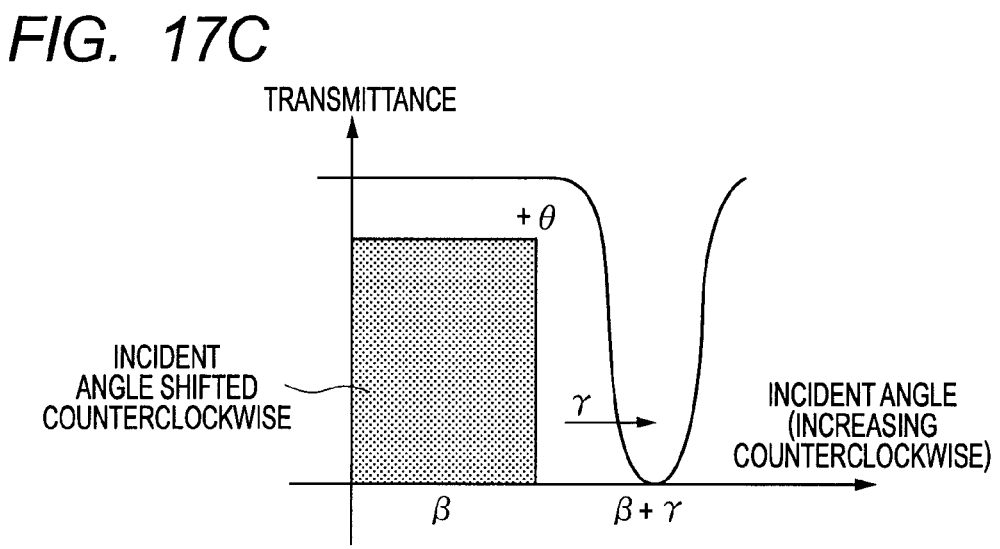
FIG. 17C is a schematic illustration of the characteristic of a guided mode resonant filter according to the second embodiment of the present invention.
Figure 18:
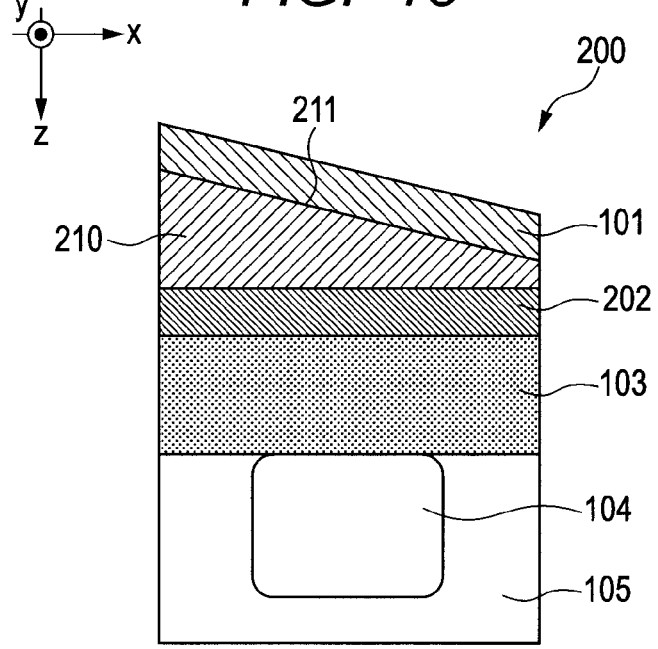
FIG. 18 is a schematic illustration of the internal structure of a ranging pixel according to the second embodiment of the present invention.

This is because light inclined counterclockwise can be more selectively detected by making the sum not smaller than a half of the angle of divergence because the other bottom of transmittance is found out of the range of the divergence of the incident flux of light that is inclined counterclockwise (FIG. 17C).

While the wavelength selective filter 101 is arranged between the guided mode resonant filter 202 and the deflecting element 210 in FIG. 13, they may be arranged in any order so long as both the wavelength selective filter 101 and the deflecting element 210 are arranged at the light-receiving side relative to the guided mode resonant filter 202.

In other words, the wavelength selective filter 101 can be arranged at the light-receiving side relative to the deflecting element 210.

While the deflecting element 210 in FIG. 13 is adapted to bend the principal ray of the incident flux of light by the surface 211 that is inclined from the light-receiving surface (xy surface) of the silicon substrate 105, the present invention is by no means limited to the use of such a deflecting element.

Alternatively, the principal ray of the incident flux of light may be bent by means of a deflecting element having a refractive index distribution that monotonously changes in a direction perpendicular to the principal ray of the incident flux of light striking the ranging pixel.

Figure 19:
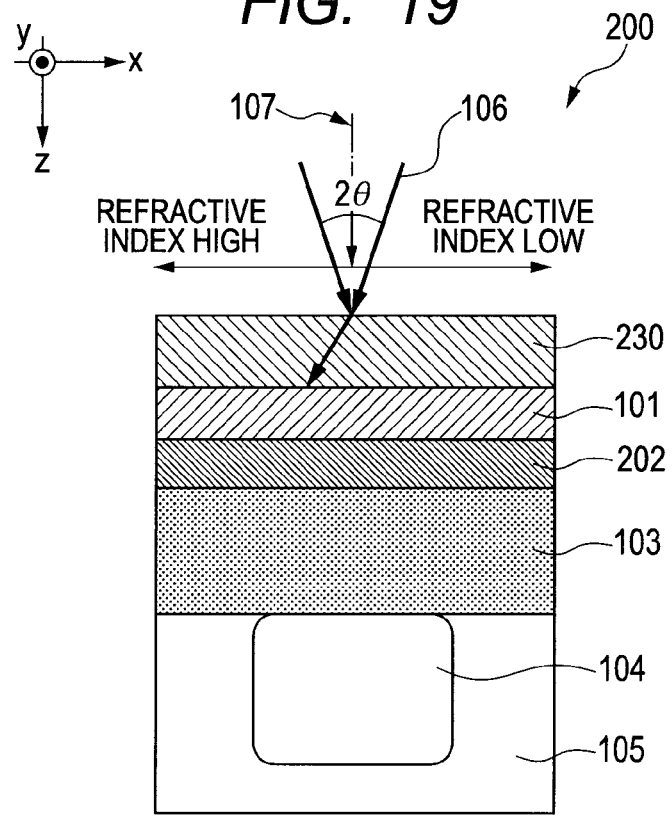
FIG. 19 is another schematic illustration of the internal structure of a ranging pixel according to the second embodiment of the present invention.

More specifically, as illustrated in FIG. 19, a deflecting element 230 having a refractive index distribution that decreases from the −x direction toward the +x direction, the x-direction being perpendicular to the principal ray 107 of the incident flux of light, may be employed.

Because the principal ray 107 of the incident flux of light 106 is bent clockwise due to the refractive index distribution of the deflecting element 230, the deflecting element 230 plays the same role as the deflecting element 210.

Techniques of providing a refractive index distribution include one that makes the medium density represent high density parts and low density parts and one that disperses micro particles.

Now, a method of manufacturing the solid state image sensor of this embodiment will be described below by referring to FIGS. 20A and 20B.

Since the steps down to the step of preparing an absorption filter after forming a photoelectric conversion layer in a silicon substrate are the same as those of FIG. 11A through 11C, they will not be described here repeatedly.

Figure 20A:
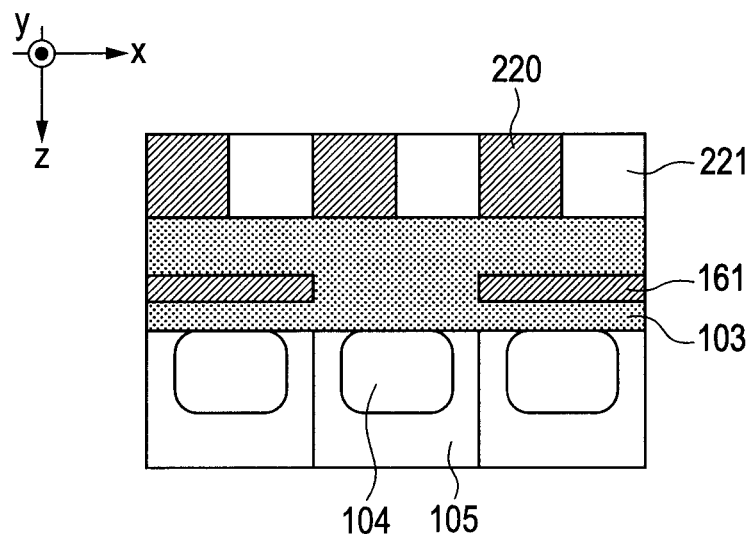
FIG. 20A is a schematic illustration of the method of manufacturing the solid state image sensor according to the second embodiment of the present invention.
Figure 20B:
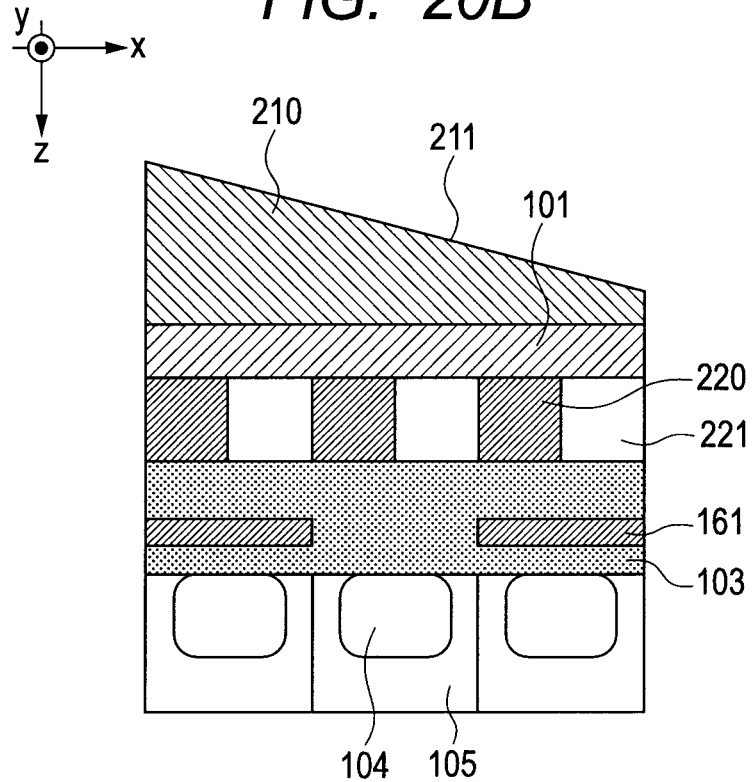
FIG. 20B is a schematic illustration of the method of manufacturing the solid state image sensor according to the second embodiment of the present invention.

After the step of FIG. 11C, another SiO$_2$ layer is laid so as to represent a flat surface and then a high permittivity section 220 and a low permittivity section 221 are arranged periodically to form a guided mode resonant filter (FIG. 20A).

After preparing a wavelength selective filter typically by applying a pigment, SiO$_2$ is deposited once again. Then, a sacrifice layer 280 representing a thickness that continuously increases from the +x direction toward the −x direction is prepared and a dry etching operation is conducted thereon.

Then, the SiO$_2$ layer is left unetched to represent a large thickness at thick parts of the sacrifice layer 280 (FIG. 20B) as in the step of FIG. 11D.

The inclined surface of SiO$_2$ corresponds to the inclined surface 211 of the deflecting element 210.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-257240, filed Nov. 17, 2010, which is hereby incorporated by reference herein in its entirety.

What is claimed is:

1. A solid state image sensor, comprising:
   a substrate;
   a plurality of pixels, each having a photoelectric conversion section formed in said substrate and a light-receiving section formed on the side of a light-receiving surface of said substrate, at least some of said plurality of pixels being ranging pixels, the photoelectric conversion section and the light-receiving section of each of said ranging pixels arranged to define a central line passing a center of the photoelectric conversion section and extending perpendicularly to said substrate through the photoelectric conversion section and the light-receiving section; and
   the light-receiving section of each of said ranging pixels comprising a filter having periodically arranged high and low permittivity sections, said filter being adapted to reflect incident light getting into the inside of said light-receiving section at a specific incident angle, wherein
   the solid state image sensor comprises a pair of ranging pixels arranged such that the normal line of the filter and the principal ray of the incident flux of light striking the filter represent a same angle of inclination but are inclined in opposite directions in each of the ranging pixels and outputs a signal for a ranging operation, using the signals from said pair of ranging pixels, and
   said filter is configured so as to respectively define first and second normal lines to the filter at first and second points thereof within a plane including the central line such that the first and second points are arranged on opposite sides relative to the central line, the first and second normal lines being parallel and inclined at an angle relative to a principal ray of a flux of light entering said filter.

2. The solid state image sensor according to claim 1, wherein at least one of said filters is so arranged to make the normal line inclined by a predetermined angle greater than zero degrees relative to the light-receiving surface.

3. The solid state image sensor according to claim 2, wherein at least one of said filters is adapted to reflect light striking the filter in a direction parallel to the normal line thereof.

4. The solid state image sensor according to claim 2, wherein the angle formed by the normal line of said filter and a principal ray of a flux of light striking said ranging pixel is smaller than half of an angle of divergence of the flux of light striking said ranging pixel.

5. The solid state image sensor according to claim 2, wherein an angle of normal line of a filter of a ranging pixel in a central area of said solid state image sensor, relative to the light-receiving surface is different from that of a filter of a ranging pixel in a peripheral area of the solid state image sensor.

6. The solid state image sensor according to claim 2, wherein said filter is asymmetric with respect to an axis normal to said light-receiving surface.

7. The solid state image sensor according to claim 1, wherein
at least one of said filters is arranged so as to make the normal line of the filter agree with a normal line of said substrate;
the solid state image sensor further comprises a deflecting element arranged at said light-receiving side relative to the filter and adapted to bend a principal ray of an incident flux of light striking said ranging pixel; and
the principal ray of the incident flux of light striking said ranging pixel bent by said deflecting element strikes the filter with a predetermined angle of deflection relative to the normal line of the filter.

8. The solid state image sensor according to claim 7, wherein at least one of said filters is adapted to reflect light striking the filter in a direction parallel to the normal line thereof.

9. The solid state image sensor according to claim 8, wherein the predetermined angle of deflection is smaller than half of an angle of divergence of the flux of light striking the ranging pixel.

10. The solid state image sensor according to claim 7, wherein at least one of said filters is adapted to reflect light striking said filter at a predetermined incident angle relative to the normal line of said filter and the predetermined angle of deflection is smaller than half of an angle of divergence of the flux of light.

11. The solid state image sensor according to claim 10, wherein the difference between the predetermined angle of deflection and the predetermined incident angle is smaller than half of the angle of divergence of the flux of light.

12. The solid state image sensor according to claim 10, wherein the sum of the predetermined angle of deflection and the predetermined incident angle is not smaller than half of the angle of divergence of the flux of light.

13. The solid state image sensor according to claim 7, wherein the deflecting elements of said plurality of ranging pixels are differentiated such that the angle formed by the principal ray bent by the deflecting element and the normal line of the filter represent a constant value for all said ranging pixels.

14. The solid state image sensor according to claim 7, wherein said deflecting element comprises a deflecting surface, the normal line of said deflecting surface being inclined relative to the principal ray of the incident flux of light entering said ranging pixel so that the principal ray of the incident flux of light entering said ranging pixel is bent by passing through said deflecting surface and enters said filter inclinedly.

15. The solid state image sensor according to claim 7, wherein
said deflecting element comprises a refractive index distribution that decreases from one side toward the other side in a direction perpendicular to the principal ray of the incident flux of light striking said ranging pixel; and
the principal ray of the incident flux of light is bent when transmitted through said deflecting element.

16. The solid state image sensor according to claim 7, wherein said deflecting element is asymmetric with respect to an axis normal to said light-receiving surface.

17. The solid state image sensor according to claim 1, comprising a wavelength selective filter that selectively transmits light having the wavelength to be used for ranging operations arranged at the light-receiving side of each of said ranging pixels relative to said filter thereof.

18. The solid state image sensor according to claim 1, further comprising absorption filters for absorbing light having the wavelength to be used for ranging operations, said absorption filters being arranged respectively in the pixels neighboring each of said ranging pixels.

19. The solid state image sensor according to claim 1, wherein said filter is arranged continuously across a plurality of pixels including at least said ranging pixels.

20. The solid state image sensor according to claim 1, wherein said filter is configured such that the transmittance of light striking said filter from the direction inclined clockwise by a predetermined angle from the principal ray is different from the transmittance of light striking said filter from the direction inclined counterclockwise by the predetermined angle from the principal ray.

21. A camera comprising: the solid state image sensor according to claim 1 and a camera lens.

* * * * *